June 18, 1968 J. L. SCHMIDT ETAL 3,389,306

COMPUTER GROUNDING ASSEMBLY HAVING CARD GUIDE BEAMS AND GRIPPING MEMBERS

Filed May 23, 1966 2 Sheets-Sheet 1

INVENTOR.
JAMES L. SCHMIDT
DANIEL SINNOTT

BY Allan Ratner

INVENTOR.
JAMES L. SCHMIDT
DANIEL SINNOTT
BY
Allan Ratner

United States Patent Office 3,389,306

Patented June 18, 1968

3,389,306

COMPUTER GROUNDING ASSEMBLY HAVING CARD GUIDE BEAMS AND GRIPPING MEMBERS

James L. Schmidt, Red Bank, and Daniel Sinnott, Wanamassa, N.J., assignors to Electronic Associates, Inc., Long Branch, N.J., a corporation of New Jersey Filed May 23, 1966, Ser. No. 552,241
4 Claims. (Cl. 317—101)

ABSTRACT OF THE DISCLOSURE

A computer assembly for a plurality of printed circuit boards, each having a metallic rim formed on both surfaces. A plurality of spaced rigid rectangular shaped card guide beams are connected perpendicular to a ground plane sheet forming parallel rows and columns. The circuit boards are received between adjacent rows of beams with each beam having a circuit board on opposing two sides thereof. A pair of thin sheet metal gripping members are secured to the remaining opposing two sides of each card guide beam over a major portion of the length of the beam. Each pair of gripping members forms flat planes parallel to each other and extending beyond the first named opposing sides of the beam.

Figure 1:
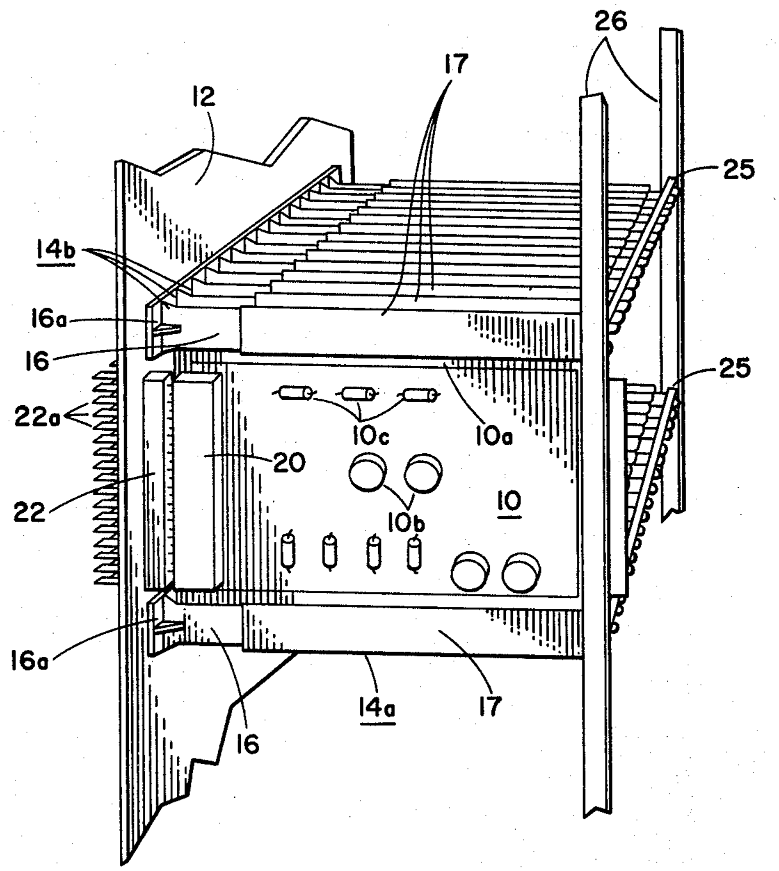

The invention relates to computer mounting structure and more particularly to providing a low impedance grounding assembly for a computer.

Many computer mounting structures comprise a plurality of spaced card guides for mounting a plurality of printed circuit boards with each of the boards carrying one or more computing elements. It has been known to provide each of the circuit boards with a multiple contact connector to removably engage a mating multiple contact connector with the mating connectors being secured to the mounting structure. In this manner, each of the circuit boards may be inserted into a corresponding card guide until its multiple contact connector engages the corresponding mating multiple contact connector secured to the computer structure.

In order to provide high quality transmission of binary signals in computers such as digital computers, an electrical ground has been established so that any of the electronic components which have potentials above ground are located physically a relatively short distance from ground. The purpose of decreasing the component distance to ground is to have ground return paths as short as possible thereby to minimize ground noise. In order to achieve the foregoing, prior computers have utilized ground planes formed as close as possible to the computing elements. Specifically, such ground planes have been formed by metallic sheets each providing a two dimensional ground plane for the printed circuit boards. However, such ground planes have left much to be desired in their distance from the electronic components so that excessive ground noise has been generated.

Accordingly, an object of the present invention is a ground for providing substantially short ground return paths from substantially all electronic components mounted on the printed circuit boards.

Another object of the present invention is parallel planes of grounding mesh connected together and to a substantially solid ground plane sheet to form a high quality three dimensional ground.

In accordance with the present invention there is provided a computer mounting structure for a plurality of printed circuit boards in which each of the circuit boards has a printed circuit metallic rim formed on both of its sides adjacent to the edges of the board. Each of the circuit boards has a first multiple contact connector secured adjacent to one end of the board and adapted to removably engage a mating end of a corresponding second contact connector. An end of each of the second multiple contact connectors has extending therefrom a plurality of conductive tails with each tail being surrounded by an electrically insulating material projecting a portion of its length from the second connector.

A ground plane metal sheet is provided having the second connectors secured to one side thereof. The ground plane is substantially solid except for apertures sufficient to just accommodate the insulating projections of the second connectors. A plurality of spaced metal card guides extend from and are electrically connected to the ground plane. The spaced card guides are substantially perpendicular to the ground plane and form parallel rows and parallel columns or card guides. The circuit boards are received above and below each card guide to form planes of circuit boards along guide columns. The card guides each have metal frictional members for gripping corresponding circuit boards to provide electrical connections from the guides to the metallic rims of the circuit boards to define planes of rims parallel to each other. All of the parallel planes of rims are perpendicular to and connected to the ground plane to form a three dimensional ground. Thus, in accordance with the invention there is provided a substantially short distance between the three dimensional ground and any of the computing elements of the computer assembly.

Figure 2:
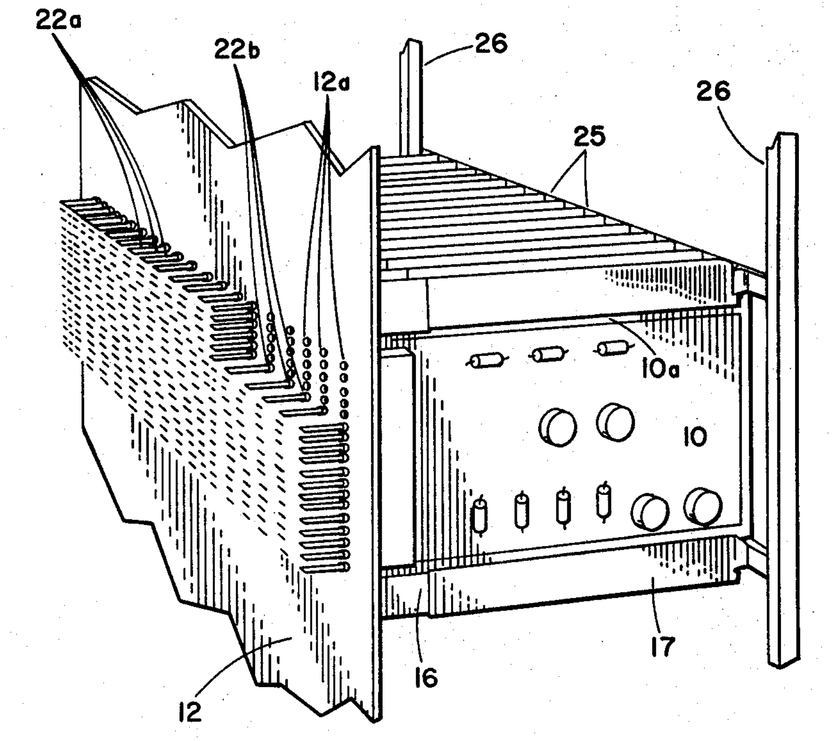

For further objects and advantages of the invention, and for a more detailed discussion for the manner in which it may be utilized in computers, reference is to be had to the following description taken in conjunction with the accompanying drawings in which:

FIG. 1 is a rear perspective view of a computer mounting structure embodying the invention; and FIG. 2 is a front perspective view of the mounting structure of FIG. 1 with a plurality of contacts removed.

Referring now to FIG. 1 there is shown a computer mounting structure or assembly for a digital computer for receiving a plurality of printed circuit boards 10, only one of which has been illustrated for purposes of clarity. The computer assembly comprises a metal ground plane 12 which is formed of a substantially solid aluminum sheet. Ground plane 12 is disposed vertically and secured to a digital computer base (not shown).

Extending from ground plane sheet 12 are a plurality of spaced card guides or guideways arranged in an upper row **14*b* and a lower adjacent row 14*a*. The guides 14*a*, 14*b* are arranged in spaced columns substantially perpendicular to the plane 12. It will be undesrtood that many more rows and columns of guides are provided with the additional rows being spaced above and below guide rows 14*b* and 14*a*** respectively.

Each of the adjacent guide rows are spaced apart from each other to receive respective circuit boards 10. Specifically, circuit boards 10 are received between adjacent guideway rows **14*a* and 14*b*. Boards 10 are received on both the sides of each card guide facing another card guide in an adjacent row. More particularly, a board 10 is received between guide row 14*b* and the next adjacent row of card guides (not shown). Another board 10 is received between guide row 14*a* and the next adjacent lower row of card guides (not shown) with the boards 10 in a column of guides forming a flat plane. It will be understood that each of the planes of boards 10 in a respective column are parallel to the other planes of boards in the other columns with all of the planes being perpendicular to the ground plane 12. It will be further understood that the columns of guides 14*a* and 14*b* are separated from each other to provide sufficient spacing between printed circuit panels 10**.

Card guides 14*a* and 14*b* each comprise a metallic beam 16 which may be made of zinc alloy having a serrated foot formed on the end of the beam adjacent the ground plane 12. Each of the serrated feet 16*a* is secured to the ground plane 12 by means of fastening devices as for example screws. These serrations cut through any oxidized coating on the ground sheet 12 to provide a good ground connection between beam 16 and the aluminum sheet 12.

Each of the beams 16 has secured to each side over a major portion of the longitudinal direction thereof a pair of opposed resilient frictional biasing members 17. Each of the members 17 may be made of a thin resilient metallic material such as nickel with each pair of members 17 biased toward each other and extending above the beam 16 to define an upper passage and extending below the beam 16 to define a lower passage. As shown in FIGS. 1 and 2 the lower passage of members 17 of card guides 14*b* and the upper passage of members 17 of card guides 14*a* engage circuit board 10. It will be understood that the upper passage of card guides 14*b* may engage circuit boards inserted between these guides, and the next adjacent upper guide row. Similarly, the lower passageway of guides 14*a* may accommodate circuit boards inserted between these guides and the next adjacent lower guide row.

For each of the guides 14*a*, 14*b* the opposed gripping members 17 are secured to the respective beam 16 as for example by welding or with fastening devices. The members 17 are biased toward each other to define a passage therebetween narrower than the corresponding circuit board 10 plus two layers of plated circuit metal. Specifically, it will be seen that circuit board 10 has an unbroken or continuous printed circuit metallic rim or band formed adjacent all of the edges of the printed circuit board. This rim or perimeter of plated metal as for example, copper, defines an unbroken grounding plane and is formed on both flat sides of the printed circuit board 10 through only one side has been illustrated in FIGS. 1 and 2.

Thus, it will now be understood that each of the members 17 grips and conductively connects to a respective rim 10*a* of a panel 10. For example in FIGS. 1 and 2 for the illustrated printed circuit 10 the upper front of rim 10*a* is engaged by and connected to the lower passage of front member 17 of the pair of members while the lower front rim 10*a* is connected to the upper passage of lower front member 17. Both of such members 17 are connected to beams 16 and to the ground plane 12. It will be also understood that the rear flat surface of circuit 10 has an upper rim 10*a* connected to a rear member 17 and a lower rear rim 10*a* connected to the lower rear member 17 with both connected to corresponding beams 16 and to the ground sheet 12. In similar manner, the upper passage of biasing member 17 of guides 14*b* engage the rims 10*a* of upper printed circuit boards 10 and the lower passage of biasing members 17 of guides 14*a* engage the conductive rims 10*a* of lower circuit boards 10. In this manner, rims 10*a* in a card guide column are connected one with the other by way of guide members 17 to define a plane of metallic rims. Specifically, circuit board 10 as illustrated is connected by way of members 17 of guide 14*a* to the rim 10*a* of a lower board 10 and from that rim to a lower rim, etc. Similarly, rim 10*a* of circuit board 10 as illustrated is connected by way of members 17 of guideway 14*b* to an upper rim and from that rim to an upper rim, etc. All of such rims 10*a* form a mesh ground plane with each rim of the mesh connected by way of a respective guide to the ground plane 12. Similarly, within each of the remaining card guide columns the rims lie in parallel ground planes with each of the planes being perpendicular to the ground plane 12.

Thus, in accordance with the invention there is provided a three dimensional ground formed by parallel mesh planes formed of rims 10*a* and guides 14, 14*b* with these parallel ground planes being connected to and perpendicular to a substantially solid ground plane 12. As a result of such three dimensional ground there is a substantially short physical distance from the electronic components to ground. As well understood by those skilled in the art, there are normally mounted on printed circuit boards 10 a plurality of electronic elements and components 10*b*, 10*c*, etc., which are electrically connected by way of the printed circuitry to a multiple contact connector 20. Components 10*b*, 10*c* together form one or more digital computing elements. Connector 20 is secured to the printed circuit board 10 and has contacts to removably engage all the female contacts of a respective multiple contact connector 22. All of connectors 22 are secured to the rear surface of plane 12. It will be understood that each of the circuit boards 10 has a corresponding male or first multiple contact connector 20 to removably engage a respective second contact connector 22 secured to the ground plane 12.

Each of the second multiple contact connectors 22 comprises a terminal block one end of which mates with the connector 20 and the other end of which has extending therefrom a plurality of conductive leaves or tails 22*a*. Each of the leaves 22*a* is surrounded by cylindrically shaped insulating material 22*b* for a portion of its length from the terminal block. It will be understood that conductive tails 22*a* are electrically connected to respective female contacts of the mating end of the second multiple contact connector 22.

As best shown in FIG. 2, ground plane sheet 12 is substantially solid or unbroken except for circular apertures 12*a* of number and diameter sufficient only to just accommodate the insulating projections 22*b* of multiple contact connectors 22. In this manner sheet 22 is substantially unbroken except for the small apertures to provide a substantially solid metal ground plane.

The power supply, signal connections and ground connections from the circuit elements 10*b*, 10*c*, etc. are connected by way of the printed circuit of board 10 to the first multiple contact connector 20, second multiple contact connector 22 and then to contacts 22*a*. In order to make sure that rim 10*a* is grounded to ground plane surface 12, each of the rims 10*a* is connected by way of its respective printed circuit through multiple contact connectors 20 and 22 to individual contacts 22*a*. Such contacts 22*a* are directly grounded to ground plane sheet 12 by means of fastening devices. In this manner, the grounding of the rims or perimeters 10*a* is assured if for some reason members 17 of the metal card guides 14*a* and 14*b* do not make good electrical contact with their associated rims.

Each of the rows of card guides 14*a*, 14*b* has a card guide link support 25 secured to the ends of the corresponding card guides remote from ground plane 12. Each of the link supports 25 is secured to its respective card guide 14*a*, 14*b* by suitable fastening devices such as screws so that links 25 are each parallel to the ground plane 12 and lie in a plane parallel to plane 12. Links 25 are mechanically supported by mechanical link supports or link spacers 26 which are spaced at intervals in the rows of card guides and disposed parallel to a respective guide column. Support links 26 rise vertically from and are secured to the base of the digital computer struture and are parallel to ground plane 12. Supports 26 may be made of nickel plated brass and are secured to and support links 25 by fastening devices. While links 25 and 26 basically provide mechanical support for card guides 14*a* and 14*b*, it will be understood that they are also electrically connected to the card guides and further provide grounding connections between the card guides. In addition, links 25 and 26 provide additional grounding areas at end of the card guides remote from the grounding plane 12.

It will be understood by those skilled in the art that the above described detailed embodiment is meant to be merely exemplary and that it is susceptible to modification and variation without departing from the spirit and scope of the invention. For example, conductive rim 10a may be formed on only one side of the printed circuit board 10 and instead of being formed of printed circuitry may be a raised strip of copper or other means adjacent the edge of card 10 forming a continuous and unbroken band or rim.

What is claimed is:

1. A computer assembly for a plurality of flat printed circuit boards each having electronic components connected together to form circuits with each of the circuit boards having a first multiple contact connector secured adjacent one end thereof and connected by way of the printed circuitry to said electronic components comprising second multiple contact connectors for each of said first connectors and each adapted to removably engage the contacts of a mating end of the associated first connector, another end of each of said second connectors having extending therefrom a plurality of conductive leaves electrically connected to said contacts of said second connector with each leaf being surrounded by an electrically insulating material projecting a portion of its length from said second connector, each of said second connectors being secured to one side of a ground plane metal sheet secured to said computer and being substantially solid except for apertures to accommodate the insulating projections of said second connectors, each of said circuit boards having a metallic rim formed on both of its flat surfaces adjacent the edges of the circuit board, a plurality of spaced metal rigid rectangular shaped four-sided card guide beams extending from, electrically connected to and substantially perpendicular to said ground plane sheet forming parallel rows and parallel columns of card guide beams, said circuit boards being received between adjacent rows of card guide beams with each card guide beam having a circuit board on first opposing two of said four sides facing another card guide beam in an adjacent row, and each of said card guide beams having secured to the second opposing remaining two sides thereof over a major portion of the length of said beam a pair of thin sheet metal resilient frictional gripping members, each pair of gripping members forming flat planes (1) parallel to each other and to said opposing sides of a respective beam (2) biased toward each other to define a passage therebetween narrower than said circuit board and rims and (3) extending beyond said first opposing sides for receiving said two respective circuit boards on said first opposing sides of said card guide beam to provide an electrical connection from said card guide to said metallic rims whereby the metallic rims of circuit boards in a card guide column are connected to each other and to the ground plane sheet to define parallel planes of metallic rims perpendicular to said ground plane sheet forming a three dimensional ground in which there is a substantially short distance from any electronic component to said three dimensional ground.

2. The computer assembly of claim 1 in which each of said printed circuit boards includes electrical connections between metallic rims and grounding contacts of said first connector and in which leaves of said second connector corresponding to said first connector grounding contacts are electrically connected to said ground plane sheet thereby to provide an additional grounding connection for said metallic rims.

3. The computer assembly of claim 2 in which there are provided a plurality of metallic card guide support links each secured to and electrically connected to a differing row of card guide beams at the end of said card guide beam remote from said ground plane sheet.

4. The computer assembly of claim 3 in which there are provided a plurality of metallic link spacer supports secured at intervals to said card guide links and electrically connected thereto.

References Cited

UNITED STATES PATENTS

| | | |
|---|---|---|
| 3,169,214 | 2/1965 | Whitehorn. |
| 3,247,424 | 4/1966 | Kossy et al. |
| 3,258,649 | 6/1966 | Arguin et al. |
| 3,258,650 | 6/1966 | Fiege. |
| 3,300,686 | 1/1967 | Johnson et al. |

ROBERT K. SCHAEFER, *Primary Examiner.*

D. SMITH, *Assistant Examiner.*